(12) United States Patent
Flowers et al.

(10) Patent No.: US 10,268,789 B1
(45) Date of Patent: Apr. 23, 2019

(54) TRANSISTOR AMPLIFIERS HAVING NODE SPLITTING FOR LOOP STABILITY AND RELATED METHODS

(71) Applicant: Cree, Inc., Durham, NC (US)

(72) Inventors: Mitch Flowers, Apex, NC (US); Ulf Andre, Hillsborough, NC (US); Khaled Fayed, Cary, NC (US); Simon Wood, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/723,286

(22) Filed: Oct. 3, 2017

(51) Int. Cl.
| | |
|---|---|
| *H01L 29/66* | (2006.01) |
| *G06F 17/50* | (2006.01) |
| *H01L 27/088* | (2006.01) |
| *H01L 23/66* | (2006.01) |
| *H01L 23/00* | (2006.01) |
| *H01L 29/778* | (2006.01) |
| *H03F 3/213* | (2006.01) |
| *H03F 3/195* | (2006.01) |
| *H03F 1/56* | (2006.01) |
| *H01L 27/02* | (2006.01) |

(52) U.S. Cl.
CPC .......... *G06F 17/5036* (2013.01); *H01L 23/66* (2013.01); *H01L 24/06* (2013.01); *H01L 24/46* (2013.01); *H01L 27/0207* (2013.01); *H01L 27/088* (2013.01); *H01L 29/7787* (2013.01); *H03F 1/56* (2013.01); *H03F 3/195* (2013.01); *H03F 3/213* (2013.01); *H01L 2223/6611* (2013.01); *H01L 2223/6655* (2013.01); *H01L 2223/6683* (2013.01); *H01L 2224/04042* (2013.01); *H03F 2200/222* (2013.01); *H03F 2200/318* (2013.01); *H03F 2200/387* (2013.01); *H03F 2200/451* (2013.01)

(58) Field of Classification Search
CPC ..... G06F 17/5036; H01L 23/66; H01L 24/06; H01L 24/46; H01L 27/0207; H01L 27/088; H01L 29/7787; H01L 2223/6611; H01L 2223/6655; H01L 2223/6683; H01L 2224/04042; H03F 1/56; H03F 3/195; H03F 3/213
See application file for complete search history.

(56) References Cited

U.S. PATENT DOCUMENTS

2013/0015924 A1* 1/2013 Andre .................. H01L 23/642
333/32

OTHER PUBLICATIONS

Pictures of CGHV59350 (Admitted Prior Art).

* cited by examiner

*Primary Examiner* — Calvin Y Choi
(74) *Attorney, Agent, or Firm* — Myers Bigel, P.A.

(57) ABSTRACT

A packaged transistor amplifier includes a package having an input lead and an output lead; a transistor stage having a plurality of unit cell transistors that are electrically coupled to the input lead in parallel, each of the unit cell transistors having an output; a first output bond pad that is coupled to a first subset of the outputs of the unit cell transistors by a first feed network; a second output bond pad that is separate from the first output bond pad, the second output bond pad coupled to a second subset of the outputs of the unit cell transistors by a second feed network; a first output bond wire coupled between the first output bond pad and the output lead; and a second output bond wire coupled between the second output bond pad and the output lead. Related design methods are also provided.

19 Claims, 9 Drawing Sheets

TRANSISTOR AMPLIFIERS HAVING NODE SPLITTING FOR LOOP STABILITY AND RELATED METHODS

FIELD

The inventive concepts described herein relate to transistor amplifiers and, more particularly, to transistor amplifiers having unit cell transistors.

BACKGROUND

Transistor amplifiers having high power handling capability are now used in a wide variety of applications. To provide increased output power, these transistor amplifiers may include transistors having large effective gate peripheries. One technique for increasing the effective gate periphery of a transistor is to provide a plurality of unit cell transistors that are connected in parallel. In such a device, the effective gate periphery may be the sum of the gate peripheries of the individual transistors.

One example type of high power transistor amplifier is the internally matched field effect transistor ("FET"), which is also referred to as an IMFET. An IMFET is a packaged transistor amplifier that includes one or more transistor amplifier integrated circuit chips that may each have a plurality of unit cell transistors that are arranged in parallel to provide a plurality of parallel amplification paths. The unit cell transistors may comprise for example, high electron mobility transistors or "HEMTs" that may be formed using wide bandgap semiconductor materials such as, for example, silicon carbide and/or gallium nitride-based semiconductor materials. The transistor amplifier integrated circuit chip(s) may be packaged in a package together with, for example, other circuit substrates such as printed circuit boards or ceramic circuit substrates that include impedance matching networks, transmission lines, power splitting and combining structures and the like. The package may include one or more input and output leads. Bond wires may be used to inter-connect the integrated circuit chips and other circuit substrates and/or to connect circuit substrates to the input/output leads of the package. IMFET transistor amplifiers may be designed to have operating frequencies that are within specific frequency bands that may fall, for example, between 100 MHz and 28 GHz or even higher frequencies.

Monolithic microwave integrated circuits ("MMIC") are another type of high power transistor amplifier that includes a plurality of unit cell transistors that are arranged in parallel along with associated matching circuits, feed networks and the like. Like IMFET transistor amplifiers, MMIC transistor amplifiers may include a plurality of unit cell HEMT transistors that are connected in parallel. The primary difference between IMFET and MMIC transistor amplifiers is that in a MMIC transistor amplifier all of the circuit elements of the amplifier—including the transistors, impedance matching networks and feed networks—are formed on a single "monolithic" integrated circuit chip, whereas an IMFET transistor amplifier may have multiple integrated circuit chips and other circuit substrates contained within the packaged device. Bond wires may be used to connect the single integrated circuit chip of a MMIC transistor amplifier to the input/output leads of the protective package.

The individual unit cell transistors in an IMFET or MMIC transistor amplifier may behave slightly differently due to inherent variations in the manufacturing and/or assembly processes used to fabricate the amplifier. While these variations may be subtle, they may be magnified by the impedance matching networks that are typically included in the device. These magnified variations may result in imbalances in phase and/or other parameters between the different legs in the parallel amplification paths, and these imbalances may give rise to oscillations in the output signal. The oscillations may take the form of spurious signals that may be generated within and/or outside of the operating frequency band of the transistor amplifier. The oscillations, whether in-band or out-of-band, may reduce the power of the desired output signal and/or may appear as additional, unwanted signals that can give rise to intermodulation products. In addition, in-band oscillations may appear as noise to the desired output signal.

If the oscillations are large enough, they may seriously degrade the performance of the amplifier. Accordingly, so-called "loop analysis" is performed during the design stage for transistor amplifiers to determine the magnitude and effect of the oscillations. If the loop analysis indicates that the oscillations are sufficiently large, a designer may then add series and/or shunt resistances along the parallel amplification paths through the unit cell transistors in order to stabilize the imbalances in order to reduce the oscillations in the output signal. Unfortunately, the inclusion of such resistances lowers both the gain and efficiency of the amplifier, and may also lower the output power level of the device, which are three of the key performance parameters for IMFET and MMIC power amplifiers.

SUMMARY

Pursuant to embodiments of the present invention, packaged transistor amplifiers are provided that include a package having an input lead and an output lead; a transistor stage having a plurality of unit cell transistors that are electrically connected in parallel and that are coupled to the input lead, each of the unit cell transistors having an output; a first output bond pad that is coupled to a first subset of the outputs of the unit cell transistors by a first feed network; a second output bond pad that is separate from the first output bond pad, the second output bond pad coupled to a second subset of the outputs of the unit cell transistors by a second feed network; a first output bond wire coupled between the first output bond pad and the output lead; and a second output bond wire coupled between the second output bond pad and the output lead.

In some embodiments, the first output bond wire may be directly connected to the first output bond pad and the second output bond wire may be directly connected to the second output bond pad.

In some embodiments, one or more circuit substrates are included within the package, and a first end of each of the first and second output bond wires may be directly connected to the one or more circuit substrates and the second end of each of the first and second output bond wires may be directly connected to the package.

In some embodiments, the packaged transistor amplifier may include at least first and second input bond pads and at least first and second input bond wires, the first and second input bond wires electrically connecting the input lead to the respective first and second input bond pads. In such embodiments, the first and second input bond wires may be directly connected to the respective first and second input bond pads.

In some embodiments, the first output bond wire may be directly connected to the first output bond pad and the second output bond wire may be directly connected to the second output bond pad.

In some embodiments, the packaged transistor amplifier may comprise a monolithic microwave integrated circuit power amplifier.

In some embodiments, the packaged transistor amplifier may comprise an internally matched field effect transistor power amplifier.

In some embodiments, the first output bond pad may be directly adjacent the second output bond pad.

In some embodiments, the packaged transistor amplifier may include different numbers of input bond wires and output bond wires.

In some embodiments, an inductance of at least one of the first and second input bond wires may differ from an inductance of at least one of the first and second output bond wires by at least 10%.

In some embodiments, the packaged transistor amplifier may further include a third output bond pad that is coupled to a third subset of the outputs of the unit cell transistors by a third feed network and a third output bond wire that is coupled between the third output bond pad and the output lead.

Pursuant to further embodiments of the present invention, packaged transistor amplifiers are provided that include a package having an input lead and an output lead; an input impedance matching network coupled to the input lead; a transistor stage having a plurality of unit cell transistors that are electrically in parallel, the transistor stage coupled to the input impedance matching network, each of the unit cell transistors having an output; an output impedance matching network coupled to the transistor stage; a plurality of output bond wires coupled between the output impedance matching network and the output lead; and an output combining node coupled to the outputs of the plurality of unit cell transistors. The plurality of output bond wires are between the transistor stage and the output combining node.

In some embodiments, each of the output bond wires may be directly connected to the package.

In some embodiments, the packaged transistor amplifier may further include first and second output bond pads, wherein a first of the output bond wires extends between the first output bond pad and a lead pad for the output lead and a second of the output bond wires extends between the second output bond pad and the lead pad for the output lead.

In some embodiments, the packaged transistor amplifier includes at least first and second output bond pads and at least first and second input bond wires that electrically connect the input lead to the respective first and second input bond pads.

In some embodiments, the first and second input bond wires may be directly connected between the package and the respective first and second input bond pads.

In some embodiments, the packaged transistor amplifier may comprise a monolithic microwave integrated circuit power amplifier and/or an internally matched field effect transistor power amplifier.

In some embodiments, the first output bond pad may be directly adjacent the second output bond pad.

In some embodiments, the packaged transistor amplifier may include different numbers of input bond wires and output bond wires.

In some embodiments, an inductance of at least one of the input bond wires may differ from an inductance of at least one of the output bond wires by at least 10%.

In some embodiments, the packaged transistor amplifier may further include a third output bond pad, wherein a third of the output bond wires is coupled between the third output bond pad and the output lead.

In some embodiments, the packaged transistor amplifier may further include a third input bond pad and a third input bond wire, wherein the third input bond wire is coupled between the third input bond pad and the input lead.

Pursuant to still further embodiments of the present invention, packaged transistor amplifier are provided that include a package having an input lead and an output lead; one or more circuit substrates within the package, the one or more circuit substrates including a plurality of electrically parallel amplification paths, each of the amplification paths coupled to the input lead and to the output lead; and a plurality of output bond wires that couple the output lead to at least one of the one or more circuit substrates. The output bond wires are between the one or more circuit substrates and a location where all of the electrically parallel amplification paths are first combined together.

In some embodiments, the packaged transistor amplifier may include at least first and second input bond pads and at least first and second input bond wires that electrically connect the input lead to the respective first and second input bond pads.

In some embodiments, the first and second input bond wires may be directly connected between the package and the respective first and second input bond pads.

In some embodiments, the packaged transistor amplifier may comprise a monolithic microwave integrated circuit power amplifier and/or an internally matched field effect transistor power amplifier.

In some embodiments, the first and second input bond wires are part of a plurality of input bond wires, and the packaged transistor amplifier may include different numbers of input bond wires and output bond wires.

In some embodiments, an inductance of the first input bond wire may differ from an inductance of at least one of the output bond wires by at least 10%.

Pursuant to yet additional embodiments of the present invention, methods of designing an amplifier are provided in which a packaged power amplifier is designed that includes a package having an input lead, an output lead and a transistor stage having a plurality of parallel amplification paths coupled between the input and output leads and located within the package; a loop analysis simulation is performed on the designed packaged power amplifier; and a location of one of an input splitting node of the packaged power amplifier where an input signal first splits to pass along plurality of parallel amplification paths and an output combining node of the packaged power amplifier where all of the plurality of parallel amplification paths first recombine is changed based on a result of the loop analysis simulation.

In some embodiments, changing a location of one of an input splitting node of the packaged power amplifier where an input signal first splits to pass along plurality of parallel amplification paths and an output combining node of the packaged power amplifier where all of the plurality of parallel amplification paths first recombine may comprise changing a number of bond wires that are between the input splitting node and the output combining node.

In some embodiments, changing a location of one of an input splitting node of the packaged power amplifier where an input signal first splits to pass along plurality of parallel amplification paths and an output combining node of the packaged power amplifier where all of the plurality of parallel amplification paths first recombine may position at least two output bond wires that connect the transistor stage to the output lead to be between the transistor stage and the output combining node.

In some embodiments, the method may further include changing a location of the other of the input splitting node of the packaged power amplifier and the output combining node of the packaged power amplifier.

In some embodiments, the method may further include performing a second loop analysis simulation prior to changing the location of the other of the input splitting node of the packaged power amplifier and the output combining node of the packaged power amplifier.

In some embodiments, changing a location of one of an input splitting node of the packaged power amplifier where an input signal first splits to pass along plurality of parallel amplification paths and an output combining node of the packaged power amplifier where all of the plurality of parallel amplification paths first recombine based on a result of the loop analysis simulation may comprise sub-dividing an input bond pad and/or an output bond pad.

In some embodiments, the packaged transistor amplifier may comprise a monolithic microwave integrated circuit power amplifier.

In some embodiments, the packaged transistor amplifier may comprise an internally matched field effect transistor power amplifier.

DETAILED DESCRIPTION

Figure 1:
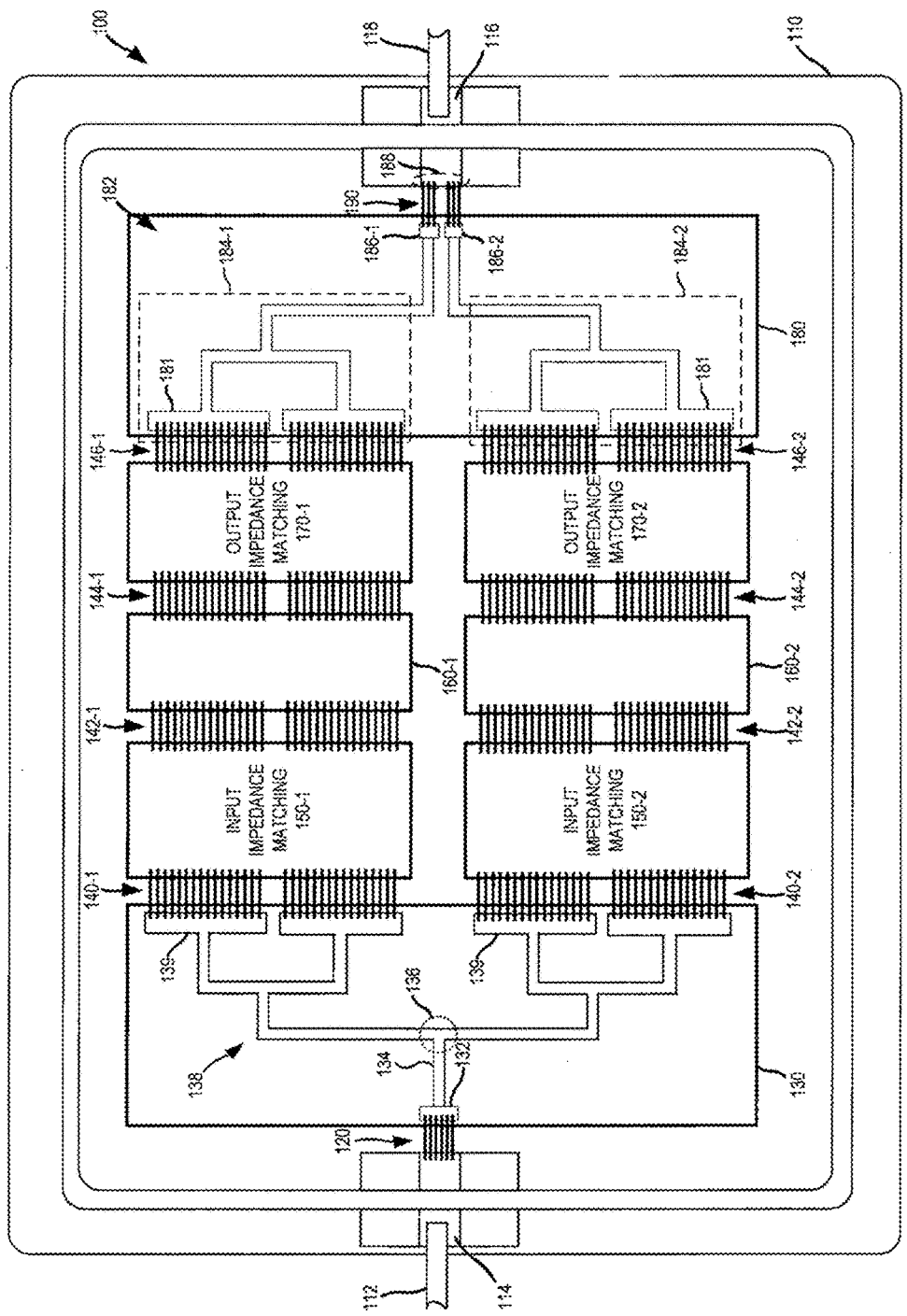
FIG. 1 is a plan view of an IMFET transistor amplifier according to embodiments of the present invention.

As discussed above, the power handling capabilities of a transistor power amplifier may be enhanced by increasing the effective gate periphery of the device. The gate periphery may be increased by (1) providing multiple parallel amplification paths and/or (2) by increasing the gate width on each individual amplification path. The provision of parallel amplification paths creates one or more loops in the device. These loops extend from a first location where an input RF signal is first split to pass to the parallel unit cell transistors to a second location where all of the individual paths have recombined into a single output signal. As discussed above, as the width of the gate fingers is increased, subtle variations in the device characteristics are magnified and this can introduce imbalances that cause oscillations in the form of unwanted signals that may be in or out of the operating frequency range of the device. Such oscillations may reduce the performance of a power transistor amplifier or may even render the device unusable. As a result, loop analysis may be performed during the design stage of a power transistor amplifier to ensure that the above-described oscillations are maintained within acceptable levels. When loop analysis modelling indicates that a transistor amplifier design will have unacceptable loop behavior, resistors and/or additional reactive components are added within the loops which may help to stabilize the loops and dampen any oscillations.

Pursuant to embodiments of the present invention, packaged power transistor amplifiers are provided that have a plurality of electrically parallel amplification paths that may exhibit improved stability. In some embodiments, these packaged power transistor amplifiers may have "split" input and/or output bond pads. The split input bond pads may each be coupled to an input lead of the transistor amplifier package by one or more input bond wires, and the split output bond pads may each be coupled to an output lead of the transistor amplifier package by one or more output bond wires. Splitting the input and/or output bond pads is sometimes referred to herein as "node splitting."

Conventional packaged power transistor amplifiers typically include an input lead that is connected to an input bond pad on an integrated circuit chip or circuit substrate by one or more input bond wires. In these conventional devices, a first end of each input bond wire may be connected (e.g., by thermos-compression of soldering) to a lead pad that is connected to the input lead, and the second end of each input bond wire may be connected to the input bond pad. Likewise, a first end of each output bond wire may be connected to the output bond pad, and the second end of each output bond wire may be connected to a lead pad that is connected to the output lead. With this conventional design, both (1) the input splitting node where an RF signal that is input to the device is split to flow down the parallel amplification paths and (2) the output combing node where the parallel amplification paths re-combine after amplification were both on an integrated circuit chip or circuit substrate. As such, the input bond wires and the output bond wires were outside the "loops" formed by the parallel amplification paths between the input splitting node and the output combing node.

In the packaged power transistor amplifiers according to embodiments of the present invention, the location of one or both of the input splitting node and the output combining node may be moved so that the input bond wires and/or the output bond wires are within the "loops" formed by the parallel amplification paths within the device. These input and output bond wires may have high levels of inductance, and reconfiguring the transistor amplifier so that this inductance is within the loops may stabilize the device. Moreover, since the input and output bond wires are already present in the device, relocating the positions of the input splitting node and/or the output combining node may have essentially no impact on other aspects of the device performance, such as the impedance matching circuits. As such, the techniques according to embodiments of the present invention provide a convenient way of stabilizing a device without the need to redesign the circuits in the device. Thus, the node splitting techniques according to embodiments of the present invention may provide an easy and convenient way to stabilize oscillations in a power transistor amplifier without having to modify other aspects of the circuit design or add resistors that negatively impact the performance of the device.

In some embodiments, a packaged transistor amplifier is provided that includes a package having an input lead and an output lead. A transistor stage is coupled to the input lead. The transistor stage may include a plurality of unit cell transistors that are electrically disposed in parallel to each other. Each of the unit cell transistors may have an output, such as a drain contact. The packaged transistor amplifier further includes first output bond pad that is coupled to a first subset of the outputs of the unit cell transistors by a first feed network and a second, separate output bond pad that is coupled to a second subset of the outputs of the unit cell transistors by a second feed network. A first output bond wire is coupled between the first output bond pad and the output lead, and a second output bond wire coupled between the second output bond pad and the output lead. Since different ones of the unit cell transistors are coupled to the output lead through the first and second output bond wires, the first and second output bond wires are within the feedback loops and hence the inductance of these output bond wires may be used to help stabilize the device.

In other embodiments, a packaged transistor amplifier is provided that includes a package having an input lead and an output lead. An input impedance matching network is coupled to the input lead, and a transistor stage is coupled to the input impedance matching network. The transistor stage may include a plurality of unit cell transistors that are electrically disposed in parallel to each other. Each of the unit cell transistors may have an output, such as a drain contact. An output impedance matching network is coupled to the transistor stage. A plurality of output bond wires are coupled between the output impedance matching network and the output lead, and the device further includes an output combining node where all of the outputs of the plurality of unit cell transistors are combined. The output bond wires are between the transistor stage and the output combining node so that they are within the feedback loops.

In still other embodiments, a packaged transistor amplifier is provided that includes a package having an input lead and an output lead. One or more circuit substrates are mounted within the package, the one or more circuit substrates including a plurality of parallel amplification paths, each of the amplification paths coupled to the input lead and to the output lead. Output bond wires connect the output lead to at least one of the one or more circuit substrates. The output bond wires are between the one or more circuit substrates and a location where all of the parallel amplification paths are first combined together.

Pursuant to still further embodiments, an amplifier design method is provided in which a packaged power amplifier is designed. The packaged power amplifier includes a package having an input lead and an output lead and a transistor stage having a plurality of parallel amplification paths coupled between the input and output leads and mounted within the package. After the design is completed, a loop analysis simulation is performed. If the loop analysis simulation indicates that the device has an unacceptable level of instability, a location of one of (1) an input splitting node of the packaged power amplifier where an input signal first splits to pass along plurality of parallel amplification paths and (2) an output combining node of the packaged power amplifier where all of the plurality of parallel amplification paths first recombine is then changed.

Embodiments of the present invention will now be described in greater detail with reference to the attached figures.

FIG. 1 is a schematic plan view (i.e., looking down at the device from above) of an IMFET power transistor amplifier 100 according to embodiments of the present invention. In FIG. 1 (and various of the other figures) the package thereof shown in shadow view to illustrate the circuit elements within the package. The IMFET power transistor amplifier 100 may have a gain of, for example, between 10-20 dB (although it could be lower or higher) and hence may increase a level of an input signal by a factor of, for example, 10-100 times in example embodiments.

As shown in FIG. 1, the IMFET transistor amplifier 100 includes a plurality of circuit substrates that are contained within a package 110. The circuit substrates may include one or more integrated circuit chips and may also include other circuit substrates such as, for example, printed circuit boards or ceramic circuit substrates. Herein, integrated circuit chips and other substrates such as printed circuit boards or ceramic circuit substrates will be collectively referred to as "circuit substrates."

As shown in FIG. 1, the circuit substrates may include input and output circuit substrates 130, 180, impedance matching circuit substrates 150-1, 150-2, 170-1, 170-2, and transistor amplifier integrated circuit chips 160-1, 160-2. Herein, when more than one instance of a particular element is included in a device the elements may be referred to individually by their full reference numeral (e.g., transistor amplifier integrated circuit chip 160-2) and collectively by the first part of the reference numeral (e.g., the transistor amplifier integrated circuit chips 160).

Input bond wires 120 and output bond wires 190 are provided that connect the package 110 to the respective circuit substrates 130, 180, and internal bond wires 140 142, 144, 146 are provided that interconnect the input and output circuit substrates 130, 180, the impedance matching circuit substrates 150-1, 150-2, 170-1, 170-2 and the transistor amplifier integrated circuit chips 160-1, 160-2.

The circuit substrates 130, 150, 160, 170, 180 are included within the package 110. The package 110 includes an input lead 112 and an output lead 118. The input lead 112 may be electrically connected to an input lead pad 114 by, for example, soldering. One or more input bond wires 120 may electrically connect the input lead pad 114 to an input bond pad 132 on input circuit substrate 130. A first end of each input bond wire 120 may be directly connected to the input lead pad 114 and a second end of each input bond wire 120 may be connected to the input bond pad 132 in some embodiments. Each input bond wire 120 may be connected to the input lead pad 114 and the input bond pad 132 by, for example, thermocompression.

The input circuit substrate 130 may comprise any appropriate substrate. In some embodiments the input circuit substrate 130 may comprise a ceramic circuit substrate (e.g., an alumina substrate) that has a conductive ground plane on one side thereof and conductive traces on the opposite side thereof that form RF transmission lines and pads such as the input bond pad 132. The conductive metal may comprise, for example, gold, copper or alloys thereof. A first RF transmission line 134 connects the input bond pad 132 to an input splitting node 136. The input splitting node 136 serves as an input to a corporate feed network 138 that is used to couple an RF input signal that is input on the input lead 112 and passed to the input bond pad 132 to the gate fingers of a plurality of unit cell transistors that are included in the transistor amplifier integrated circuit chips 160-1, 160-2 (see FIG. 2A and discussion thereof below). As shown in FIG. 1, the corporate feed network 138 splits any RF input signal into a plurality of sub-components that travel to output pads 139.

The first and second transistor amplifier integrated circuit chips 160-1, 160-2 typically have an input impedance that is much lower than the impedance seen at the input lead 112 (which may be, for example, 50 ohms). Accordingly, the IMFET transistor amplifier 100 further includes input impedance matching circuit substrates 150-1, 150-2 that improve the impedance match between the input lead 112 and the transistor amplifier integrated circuit chips 160-1, 160-2 over the operating frequency band of the IMFET transistor amplifier 100. Each input impedance matching circuit substrate 150-1, 150-2 may include transmission lines and reactive components such as capacitors and/or inductive elements. Internal bond wires 140-1, 140-2 extend between each output pad 139 and a respective one of the input impedance matching circuit substrates 150-1, 150-2 to pass the sub-components of an input signal to the input impedance matching circuit substrates 150-1, 150-2. In an example embodiment, each input impedance matching circuit substrate 150-1, 150-2 may be implemented, for example, as a ceramic substrate having plate capacitors thereon. Internal bond wires 142-1, 142-2 extend between outputs of each input impedance matching circuit substrates 150-1, 150-2 and the respective first and second transistor amplifier integrated circuit chips 160-1, 160-2. The combination of the internal bond wires 140, the capacitors on the input impedance matching circuit substrates 150 and the internal bond wires 142 form an inductor-capacitor-inductor (LCL) reactive circuit. This reactive circuit (i.e., the combination of the internal bond wires 140, 142 and the input impedance matching circuit substrates 150) may reduce reflections, thereby improving the return loss and insertion loss performance of the IMFET device 100. It will be appreciated that other impedance matching circuit designs or implementations may be used.

Figure 2A:
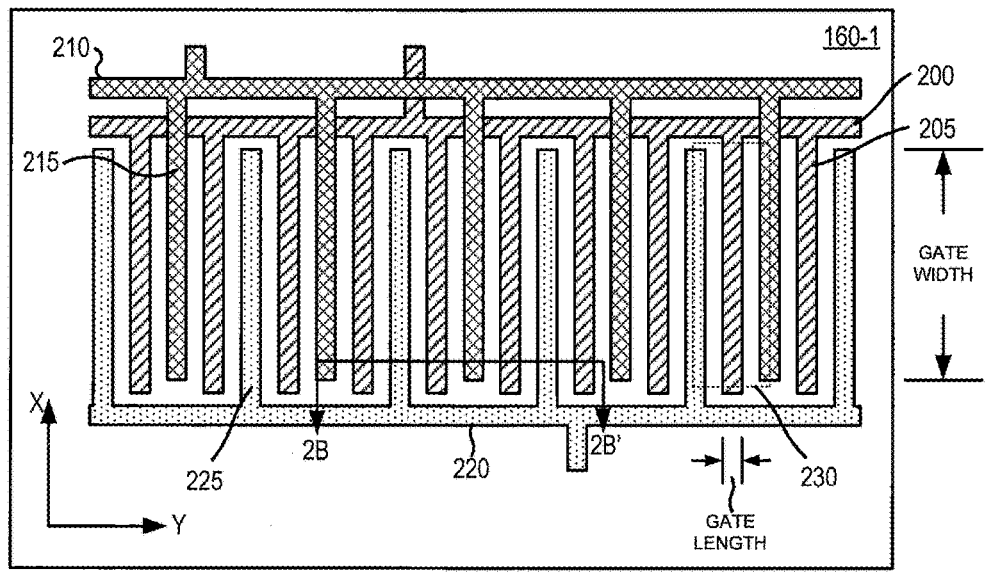
FIG. 2A is an enlarged schematic view of a subset of the unit cell transistors of the IMFET transistor amplifier of FIG. 1.
Figure 2B:
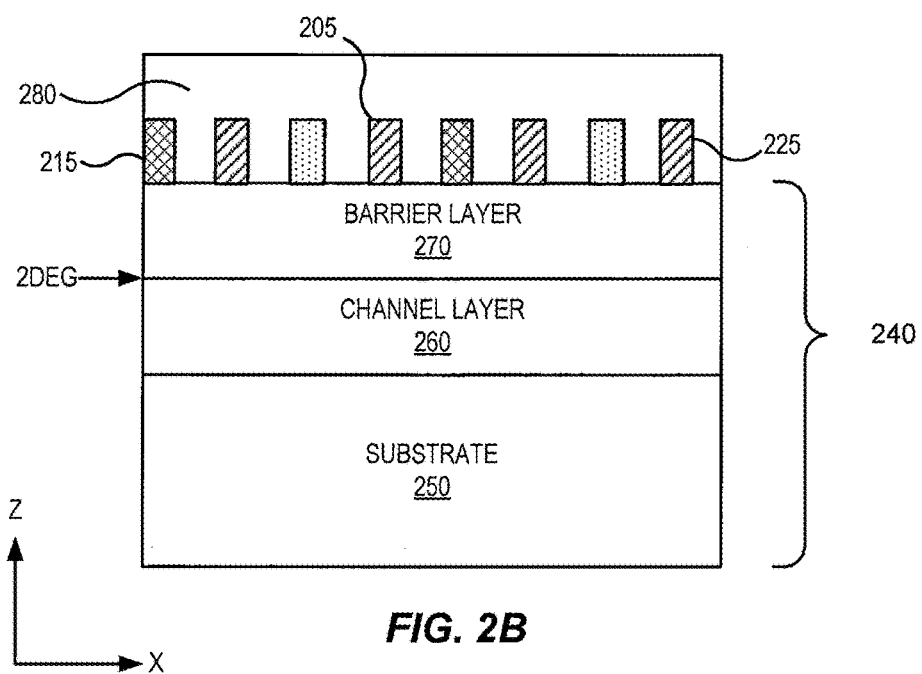
FIG. 2B is a schematic cross-sectional view taken along line 2B-2B of FIG. 2A.

The unit cell transistors that amplify the input signal are implemented on the first and second transistor amplifier integrated circuit chips 160-1, 160-2. FIGS. 2A and 2B are schematic diagrams that illustrate the structure of these integrated circuit chips 160 in more detail. In particular, FIG. 2A is a schematic plan view of the metal layout of a subset of the unit cell transistors that are included in the transistor amplifier integrated circuit chip 160-1. FIG. 2B is a schematic cross-sectional view taken along line 2B-2B' of FIG. 2A that illustrates the semiconductor and metal layer structure of the unit cell transistors included in the transistor amplifier integrated circuit chip 160-1.

As shown in FIG. 2A, the integrated circuit chip 160-1 includes a gate bus 200 that is connected to a plurality of gate fingers 205 that extend in parallel in a first direction (e.g., the y-direction indicated in FIG. 2A). The gate bus 200 may be connected to the internal bond wires 142-1 via connections that are not shown in FIG. 2A. A source bus 210 is connected to a plurality of parallel source contacts 215. The source bus 210 may be connected to a ground voltage node on the underside of the integrated circuit chip 160-1. A drain bus 220 is connected to a plurality of drain contacts 225. The drain bus 220 may be connected to the internal bond wires 144-1 via connections that are not shown in FIG. 2A.

As can be seen in FIG. 2A, each gate finger 205 runs along the y-direction between a pair of adjacent source and drain contacts 215, 225. The transistor amplifier integrated circuit chip 160-1 includes a plurality of unit cells 230, where each unit cell 230 comprises an individual transistor. One individual unit cell transistor 230 is illustrated by the dashed box in FIG. 2A, and includes a gate finger 205 that extends between adjacent source and drain contacts 215, 225. The "gate width" refers to the distance by which the gate finger 205 overlaps with its associated source and drain contacts 215, 225 in the y-direction. That is, "width" of a gate finger 205 refers to the dimension of the gate finger 205 that extends in parallel to the adjacent source/drain contacts 215, 225 (the distance along the y-direction). Each unit cell transistor 230 may share a source contact 215 and/or a drain contact 225 with one or more adjacent unit cell transistors 230. Although a total of ten unit cell transistors 230 are illustrated in FIG. 2A, it will be appreciated that the transistor amplifier integrated circuit chip 160-1 may include more or less unit cell transistors 230. The transistor amplifier integrated circuit chip 160-2 may be identical to the transistor amplifier integrated circuit chip 160-1 in some embodiments, or may differ in some respects (e.g., one of the transistor amplifier integrated circuit chips 160 may include more unit cell transistors 230 than the other transistor amplifier integrated circuit chip 160).

Referring to FIG. 2B, the transistor amplifier integrated circuit chip 160-1 comprises a semiconductor structure 240 that includes a substrate 250, which may, for example, include 4H—SiC or 6H—SiC. A channel layer 260 is on the substrate 250, and a barrier layer 270 is on the channel layer 260 so that the channel layer 260 is between the substrate 250 and the barrier layer 270. The channel layer 260 and the barrier layer 270 may include Group III-nitride based materials, with the material of the barrier layer 270 having a higher bandgap than the material of the channel layer 260. For example, the channel layer 260 may comprise GaN, while the barrier layer 270 may comprise AlGaN.

Due to the difference in bandgap between the barrier layer 270 and the channel layer 260 and piezoelectric effects at the interface between the barrier layer 270 and the channel layer 260, a two dimensional electron gas (2DEG) is induced in the channel layer 260 at a junction between the channel layer 260 and the barrier layer 270. The 2DEG acts as a highly conductive layer that allows conduction between the source and drain regions of the device that are beneath a source contact 215 and a drain contact 225, respectively. The source contact 215 and the drain contact 225 are on the barrier layer 270. Gate fingers 205 are on the barrier layer 270 between source contacts 215 and drain contacts 225. While the gate fingers 205 and source and drain contacts 215, 225 are all shown as having the same "length" in FIG. 2B, it will be appreciated that in practice the gate fingers 205 have lengths that are substantially smaller than the lengths of the source and drain contacts 215, 225, and it will also be appreciated that the source and drain contacts 215, 225 need not have the same lengths.

The material of the gate finger 205 may be chosen based on the composition of the barrier layer 270. However, in certain embodiments, conventional materials capable of making a Schottky contact to a nitride based semiconductor material may be used, such as Ni, Pt, NiSi$_x$, Cu, Pd, Cr, W and/or WSiN. The source contacts 215 and drain contacts 225 may include a metal, such as TiAlN, that can form an ohmic contact to GaN.

The drain contacts 225 may comprise the output of each unit cell transistor 230. The drain contacts 225 connect to the drain buses 220. Referring again to FIG. 1, a plurality of bond wires 144-1 connect the drain bus(es) 220 of the first and second transistor amplifier integrated circuit chips 160-1, 160-2 to respective first and second output impedance matching circuit substrates 170-1, 170-2. The connections of the internal bond wires 144-1, 144-2 to the first and second output impedance matching circuit substrates 170-1, 170-2 are not shown in FIG. 2A to simplify the drawing.

The output impedance of the first and second transistor amplifier integrated circuit chips 160-1, 160-2 typically is much lower than the impedance seen at the output lead 118. Each output impedance matching circuit substrate 170-1, 170-2 may include reactive components such as capacitors and possibly inductive elements that are used to match the impedance of the outputs of the respective transistor amplifier integrated circuit chips 160-1, 160-2 to the output lead 118 of the package 110.

The output impedance matching circuit substrates 170-1, 170-2 may each comprise, for example, a substrate such as a ceramic substrate (e.g., an alumina substrate) or a printed circuit board that has plate capacitors formed thereon. As noted above, internal bond wires 144-1, 144-2 extend between the first and second transistor amplifier integrated circuit chips 160-1, 160-2 and the output impedance matching circuit substrates 170-1, 170-2, and internal bond wires 146-1, 146-2 extend between the output impedance matching circuit substrates 170-1, 170-2 and input pads 181 on the output circuit substrate 180. The combination of the internal bond wires 144, the capacitors on the output impedance matching circuit substrates 170 and the internal bond wires 146 form an inductor-capacitor-inductor (LCL) reactive circuit. This reactive circuit (i.e., the combination of the internal bond wires 144, 146 and the output impedance matching circuit substrates 170 may reduce reflections, thereby improving the return loss and insertion loss performance of the IMFET device 100. It will be appreciated that other impedance matching circuit designs or implementations may be used.

The output circuit substrate 180 may comprise any appropriate substrate. In some embodiments the output circuit substrate 180 may comprise a ceramic substrate (e.g., an alumina substrate) that has a conductive ground plane on one side thereof and conductive pads and traces on the opposite side thereof that form RF transmission lines. A plurality of input pads 181 may be provided. The bond wires 146-1, 146-2 connect the output impedance matching circuit substrates 170-1, 170-2 to the input pads 181. The input pads 181 may be part of a corporate feed network 182 which combines the signals output from the output impedance matching circuit substrates 170-1, 170-2. The corporate feed network 182 can be viewed as two corporate feed networks 184-1, 184-2 which together form the larger corporate feed network 182.

Figure 3:
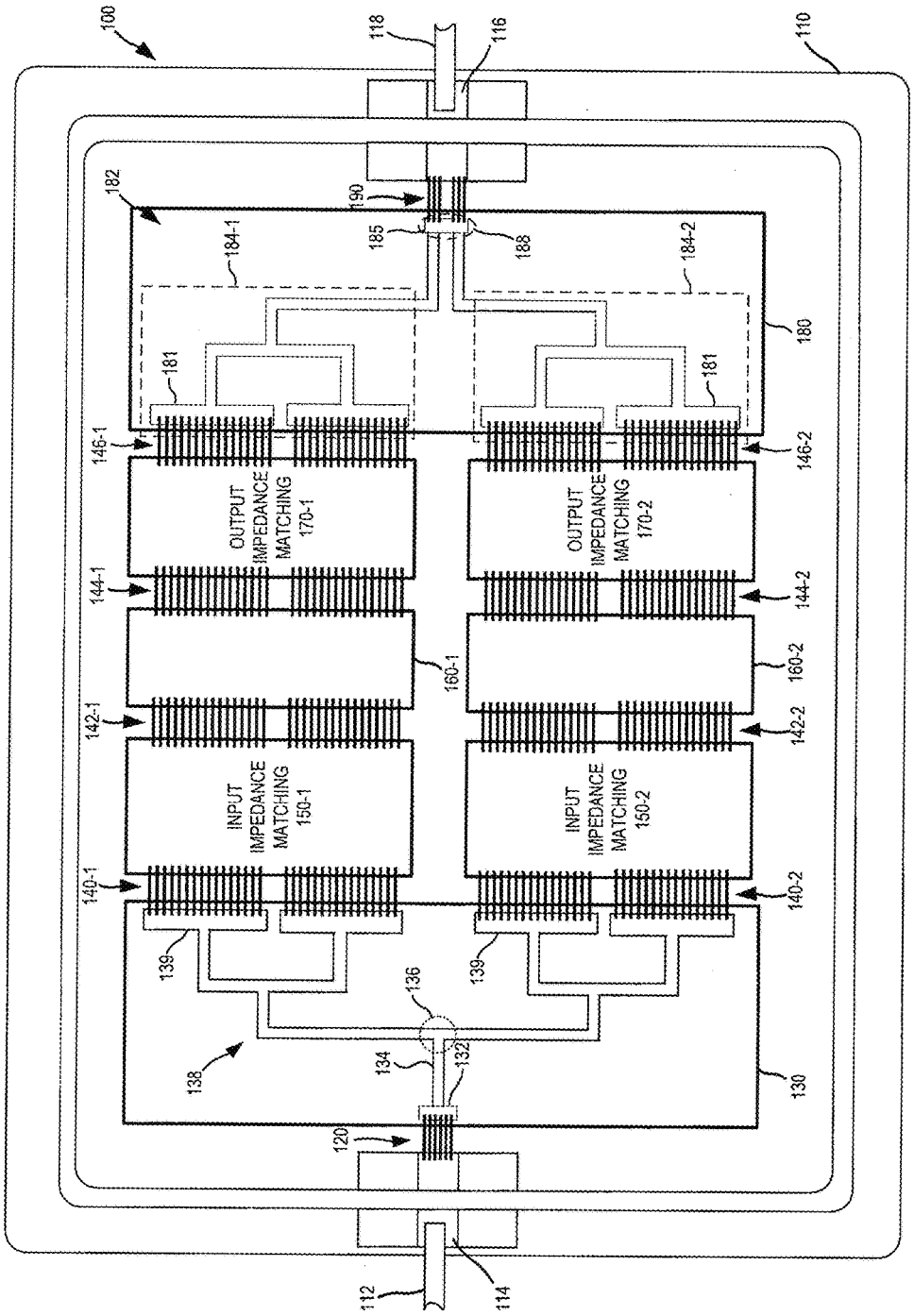
FIG. 3 is a plan view of the IMFET transistor amplifier of FIG. 1 prior to splitting of the output bond pad.

Referring now to FIG. 3, in an initial design, the corporate feed networks 184-1, 184-2 may both terminate into a single, relatively large output bond pad 185. A plurality of output bond wires 190 connect the output bond pad 185 to the output lead 118. The output lead 118 may be mounted to an output lead pad 116 by, for example, soldering. The output bond wires 190 may electrically connect the output lead pad 116 to the output bond pad 185 on the output substrate 180. A first end of each output bond wire 190 may be directly connected to the output bond pad 185 and a second end of each output bond wire 190 may be directly connected to the output lead pad 116. Each output bond wire 190 may be connected to the output lead pad 116 and the output bond pad 185 by a pair of direct solder connections. As is also shown in FIG. 3, an output combining node 188 is located at the output bond pad 185. The output combining node 188 is the location where all of the signals output from the first and second transistor amplifier integrated circuit chips 160-1, 160-2 are finally combined together (note that some combining occurs in advance of the output combining node 188 in the corporate feed networks 184-1, 184-2, but it is not until the output combining node 188 that all of the signals are combined together).

As discussed above, in high power devices, the gate fingers 205 may have long gate widths in order to increase the gate periphery (and hence power handling capability) of the device, which results in long feedback loops. Because these high power devices have large transconductance values, the feedback loops may be prone to instability. In particular, the feedback loops may generate unwanted oscillation signals which may be in and/or out of the frequency band of operation of the transistor. In either case, the generation of such oscillation signals may be problematic, and may render the transistor amplifier unusable. The instability of the feedback loops tends to increase with the length of the feedback loop. In conventional IMFET amplifiers, these loop instabilities are stabilized by, for example, adding gate resistors (not shown in FIG. 2A) in series with the gate bus 200 of FIG. 2A and/or by adding so-called odd-mode resistors (also not shown in FIG. 2A) electrically in series between two adjacent gate buses 200. These added resistances may stabilize the device and reduce or eliminate the oscillation signals. Unfortunately, these series gate resistors and odd-mode resistors lower both the gain and efficiency of the IMFET amplifier, and may also lower the output power level of the device, which are three of the key performance parameters for IMFET power amplifiers.

Conventionally, when the design of an IMFET transistor amplifier is completed, loop analysis may be performed to determine if the device exhibits sufficient stability. The loop analysis may be performed using simulation software. If the simulation indicates that the device is not sufficiently stable, the device design is typically modified to reduce the oscillations. As discussed above, the IMFET transistor amplifier may be modified by adding series gate resistors and/or odd mode resistors to stabilize feedback loops within the gate fingers and drains of the device.

With the IMFET transistor amplifier 100 of FIG. 3, if the loop analysis indicates that instabilities are present, the design of the IMFET amplifier may be very easily modified to stabilize the feedback loops according to embodiments of the present invention. In particular, referring again to FIG. 1, if the loop analysis indicates that instabilities are present, the output bond pad 185 of FIG. 3 may be split to create two separate output bond pads 186-1, 186-2 (or three or more output bond pads in other embodiments). When the circuit design is modified in this manner, the output combining node 188 moves from output bond pad 185 to the output lead pad 116 as can be seen by comparing FIG. 3 to FIG. 1. Consequently, in the original design of FIG. 3, the output bond wires 190 are outside of the loops that extend from the input splitting node 136 to the output combining node 188, while after the design is changed to have a split output bond pad 186-1, 186-2 (see FIG. 5), the output bond wires 190 are within the loops, as shown in FIG. 1. The output bond wires 190 may have a high amount of inductance and may be very low loss. Consequently, the additional reactance provided by moving the output bond wires 190 within the loops may be sufficient to stabilize the resonances and reduce or eliminate the oscillation signals.

Notably, splitting the output bond pad 185 of FIG. 3 to form two separate output bond pads 186-1, 186-2 need not affect the design of the remainder of the amplifier. Since the output bond wires 190 are already present in the device 100, the splitting of the output bond pad 185 need not impact the impedance match. Thus, by designing the IMFET amplifier 100 to have the option of a split output bond pad 185 according to various embodiments of the present invention, a circuit designer may have a very simple process for stabilizing the device 100 if it turns out that the original design is unstable. It will also be appreciated that output bond pad 135 may be split more than two ways (e.g., split three ways, four ways, etc.) and that a separate transmission line 134 may connect to each individual input output bond pad 186 formed by such a multi-way split of the output bond pad 185 in other embodiments. It will be appreciated that when the output bond pad 185 is split the split output bond pads need not have the same size or shape.

Figure 4:
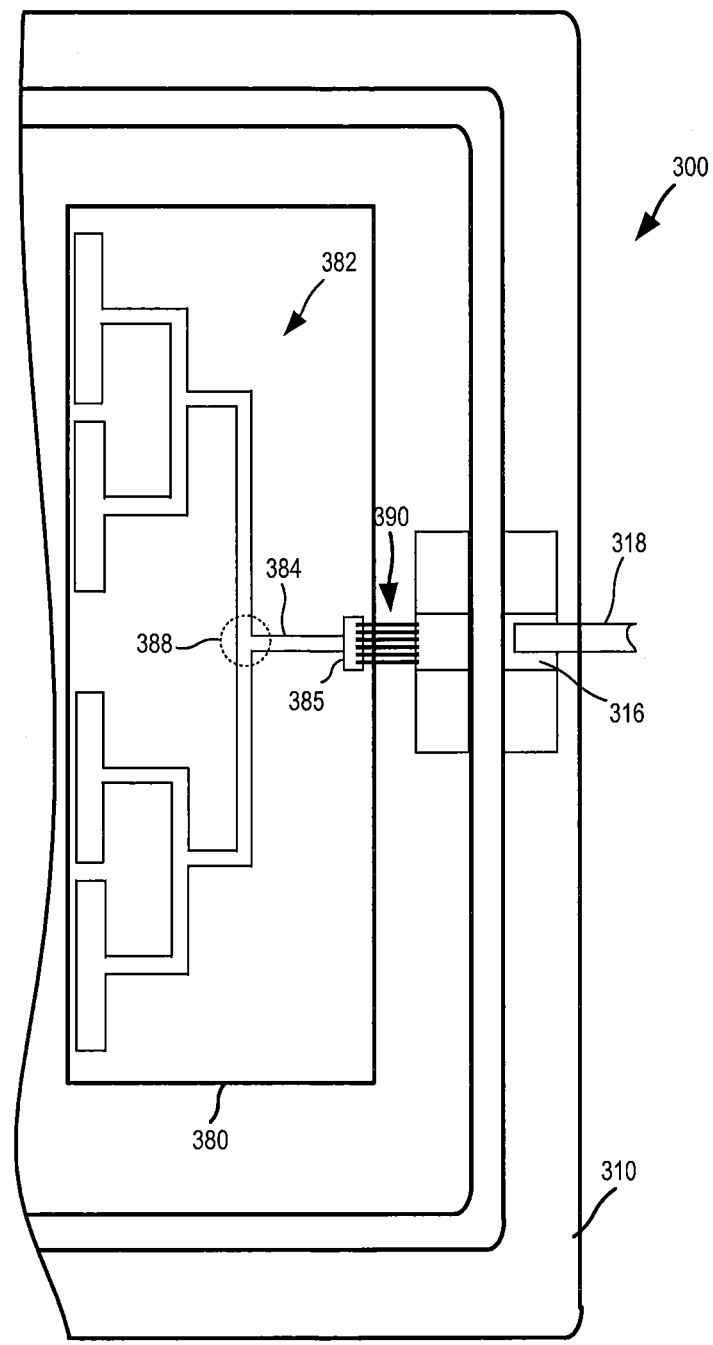
FIG. 4 is a schematic plan view of the output circuit substrate and output lead of a typical conventional IMFET transistor amplifier.

FIG. 4 is a schematic plan view of the output circuit substrate and output lead of a conventional IMFET amplifier 300. As shown in FIG. 4, the output circuit substrate 380 includes an output combining node 388 which is located at the end of a corporate feed network 382. An RF transmission line 384 connects the output combining node 388 to an RF output pad 385. A plurality of output bond wires 390 connect the output bond pad 385 to an output lead pad 316. An output lead 318 of a package 310 is soldered to the output lead pad 316.

If the conventional IMFET transistor amplifier having the output stage design shown in FIG. 4 fails loop analysis, it is necessary to modify the design of the amplifier 300 to stabilize the loop behavior. Typically, this is accomplished by adding series gate resistors and/or odd-mode resistors in the manner described above. As is also discussed above, this tends to degrade important performance aspects of the IMFET transistor amplifier.

Figure 5:
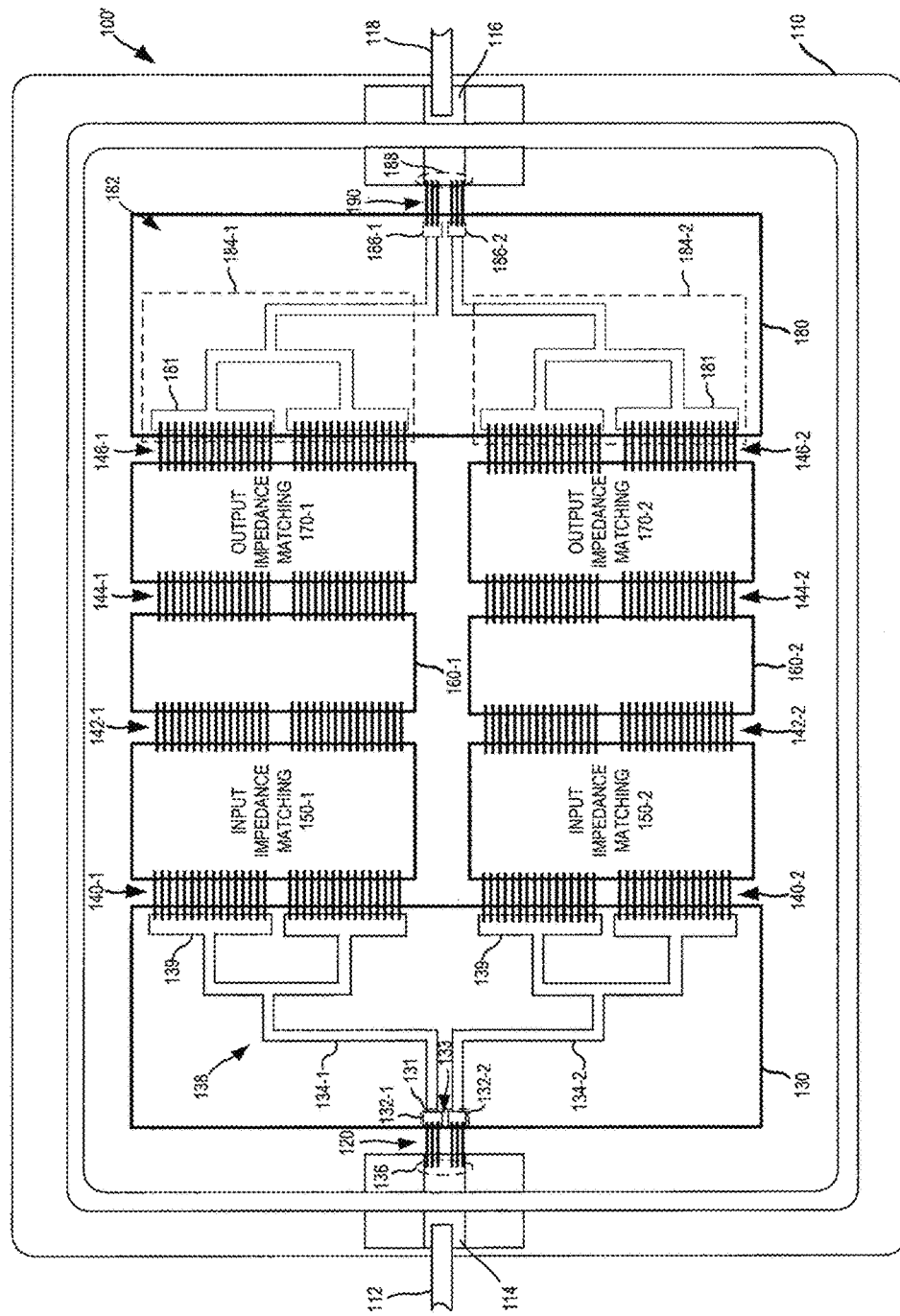
FIG. 5 is a schematic plan view of a modified version of the IMFET transistor amplifier of FIG. 1.

FIG. 5 is a schematic plan view of an IMFET transistor amplifier 100' that is a modified version of the IMFET transistor amplifier 100 of FIG. 1. As shown in FIG. 5, the IMFET transistor amplifier 100' is similar to the IMFET transistor 100, with the differences being in the design of the input circuit substrate 130. As can be seen by comparing FIGS. 1 and 3, the IMFET transistor amplifier 100' is designed so that two transmission lines 134-1, 134-2 connect to the input bond pad 131, which allows a designer to split the input pad 131 into two separate input pads 132-1, 132-2, as shown in FIG. 5, by removing the central portion of input bond pad 131 identified by arrow 133. The size of the original input bond pad 131 has been slightly exaggerated in FIG. 5 so that input bond pad 131 is more readily viewable. Input bond pad 131 is also shown by dashed lines to highlight that the device will have either input bond pad 131 or the pair of input bond pads 132-1, 132-2. It will be appreciated that input bond pad 131 may be split more than two ways (e.g., split three ways, four ways, etc.) and that a separate transmission line 134 may connect to each individual input bond pad formed by the split in other embodiments. It will be appreciated that when the input bond pad 131 is split the split input bond pads need not have the same size or shape.

It should be noted that an IMFET transistor amplifier has been sold that included a split input bond pad such as is shown in FIG. 5. In particular, the CGHV59350F IMFET transistor amplifier, which was sold by Cree, Inc. in 2015, included such a split input bond pad.

According to further embodiments of the present invention, the IMFET transistor amplifiers 100 and 100' of FIGS. 1 and 5 may be further modified. For example, in additional embodiments, the number of input bond wires 120 may be made to be different from the number of output bond wires 190. As an example, a total of four input bond wires 120 may be provided while a total of eight output bond wires 190 may be provided. Notably, if the IMFET transistor amplifier 100' of FIG. 5 is modified in this fashion, then if the device fails the loop stability test, a circuit designer has several choices for modifying the circuit design, including (1) splitting the input bond pad 131 to add the four input bond wires 120 to the loop reactance, (2) splitting the output bond pad 185 to add the eight output bond wires 190 to the loop reactance or (3) splitting the both input bond pad 131 and the output bond pad 185 to add a total of twelve bond wires 120, 190 to the loop reactance.

As another example, instead of including different numbers of input bond wires 120 and output bond wires 190 in an IMFET transistor amplifier, the physical size of the input and/or output bond wires may be varied. For example, smaller diameter input bond wires 120 may be used, which will add more inductance than larger diameter output bond wires 190. As another example, some or all of the input bond wires 120 may be shorter than the output bond wires 190, which will result in the output bond wires 190 adding more inductance. As with using different numbers of input bond wires 120 and output bond wires 190, this technique may be used to provide the designer with several different amounts of additional reactance that may be readily added to the design by splitting the input bond pad and/or the output bond pad. These two techniques may also be used together.

Pursuant to further embodiments of the present invention, the above-described bond pad splitting techniques may be used on MMIC transistor amplifiers to provide a technique for adding reactance to similar feedback loops that are present in MMIC transistor amplifiers in order to stabilize those feedback loops.

Figure 6:
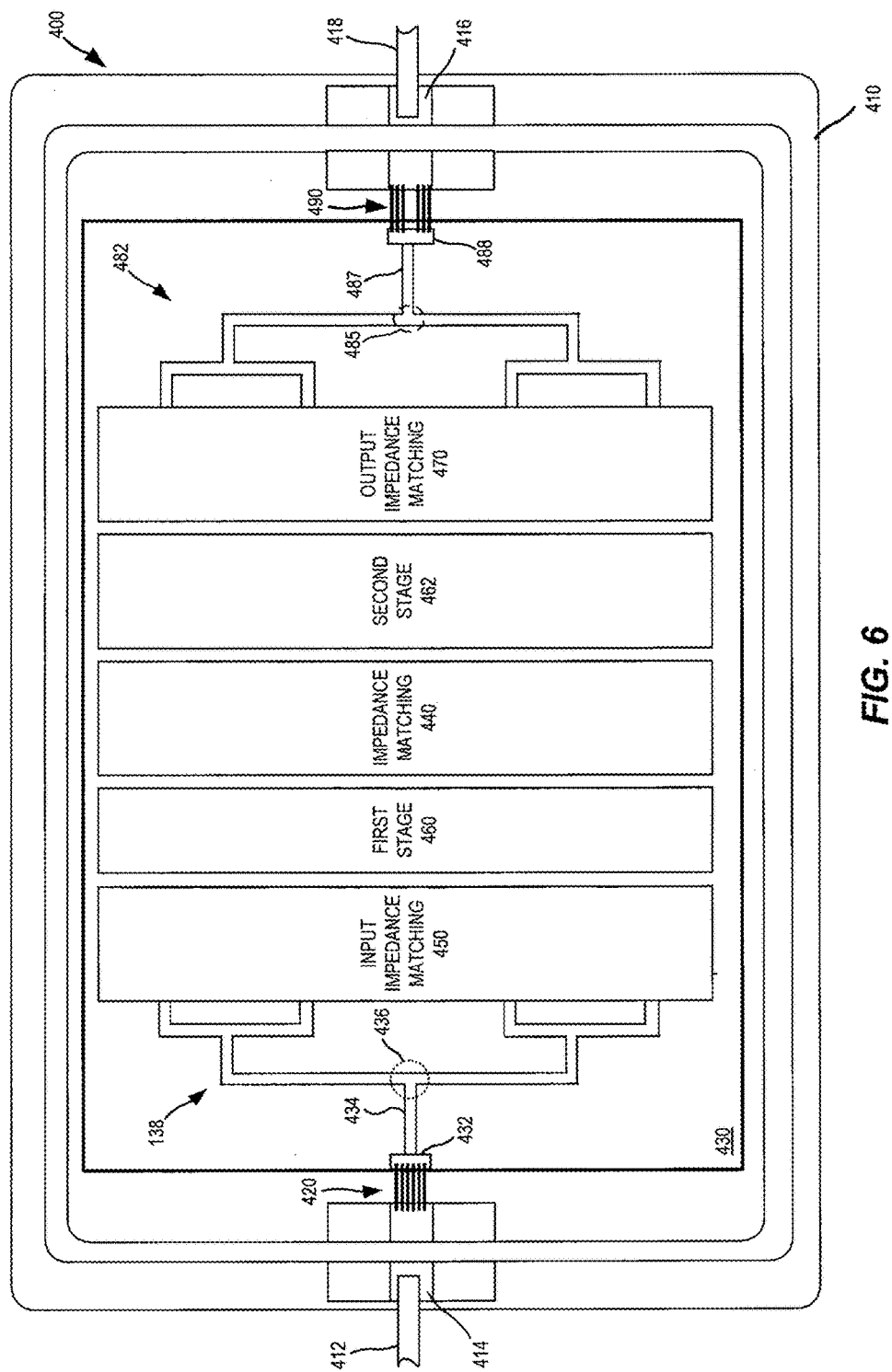
FIG. 6 is a plan view of a conventional MMIC transistor amplifier.

FIG. 6 is a plan view of a conventional MMIC transistor amplifier 400. As shown in FIG. 6, the conventional MMIC transistor amplifier 400 includes an integrated circuit chip 430 that is contained within a package 410. The package 410 includes an input lead 412 and an output lead 418. The input lead 412 may be mounted to an input lead pad 414 by, for example, soldering. One or more input bond wires 420 may electrically connect the input lead pad 414 to an input bond pad 432 on the integrated circuit chip 430. A first end of each input bond wire 420 may be directly connected to the input lead pad 414 and a second end of each input bond wire 420 may be connected to the input bond pad 432.

The integrated circuit chip 430 further includes an input splitting node 436 that is connected to the input bond pad 432 by a transmission line 434, an input impedance matching network 450, a first transistor stage 460, an intermediate impedance matching network 440, a second transistor stage 462, an output impedance matching stage 470, an output bond pad 485 and an output combining node 488. The package 410 may comprise a protective housing that surrounds and protects the integrated circuit chip 430. The package 410 may be formed of, for example, a ceramic material.

The output lead 418 may be connected to an output lead pad 416 by, for example, soldering. One or more output bond wires 490 may electrically connect the output lead pad 416 to the output bond pad 485. A first end of each output bond wire 490 may be directly connected to the output lead pad 416 and a second end of each output bond wire 490 may be connected to the output bond pad 485. A transmission line 487 connects the output bond pad 485 to a corporate feed network 482.

The MMIC transistor amplifier 400 may be very similar to an IMFET transistor amplifier, except that all of the circuitry is formed on a single semiconductor chip as opposed to the IMFET design where a plurality of integrated circuit chips and other circuit substrates are packaged together and interconnected using bond wires. The input impedance matching network 450 may serve the same function as the input impedance matching circuit substrates 150-1, 150-2 of IMFET transistor amplifier 100. Likewise, the output impedance matching network 470 may serve the same function as the output impedance matching circuit substrates 170-1, 170-2 of IMFET transistor amplifier 100. The intermediate impedance matching network 440 may serve to better match the impedance at the output of the first transistor stage 460 to the impedance at the input of the second transistor stage 462, and may be similar to input impedance matching network 450. While in the IMFET transistor amplifier 100 the impedance matching networks may, in some embodiments, be purely capacitive in nature since the internal bond wires 140, 142, 144, 146 may provide inductance, in MMIC transistor amplifier 400 the impedance matching stages 460, 440, 470 may also have inductive sections such as elongated RF transmission lines within the respective stages.

The first transistor stage 460 and the second transistor stage 462 may include a plurality of unit cell transistors that are electrically arranged in parallel, and each stage may be similar or identical to the transistor amplifier integrated circuit chips 160 included in the IMFET transistor amplifier 100. Further description thereof will be omitted. Two transistor stages 460, 462 are provided in MMIC amplifier 400 to provide increased gain. It will be appreciated that in other cases only a single transistor stage may be provided or more than two transistor stages may be provided, and the number of impedance matching stages may be adjusted accordingly.

As is further shown in FIG. 6, the input splitting node 436 and the output combining node 488 are both on the integrated circuit chip 430. As such, the input bond wires 420 and the output bond wires 490 are both external to the loop defined by the parallel amplification paths include in MMIC amplifier 400 that extend between the input splitting node 436 and the output combining node 488.

Figure 7:
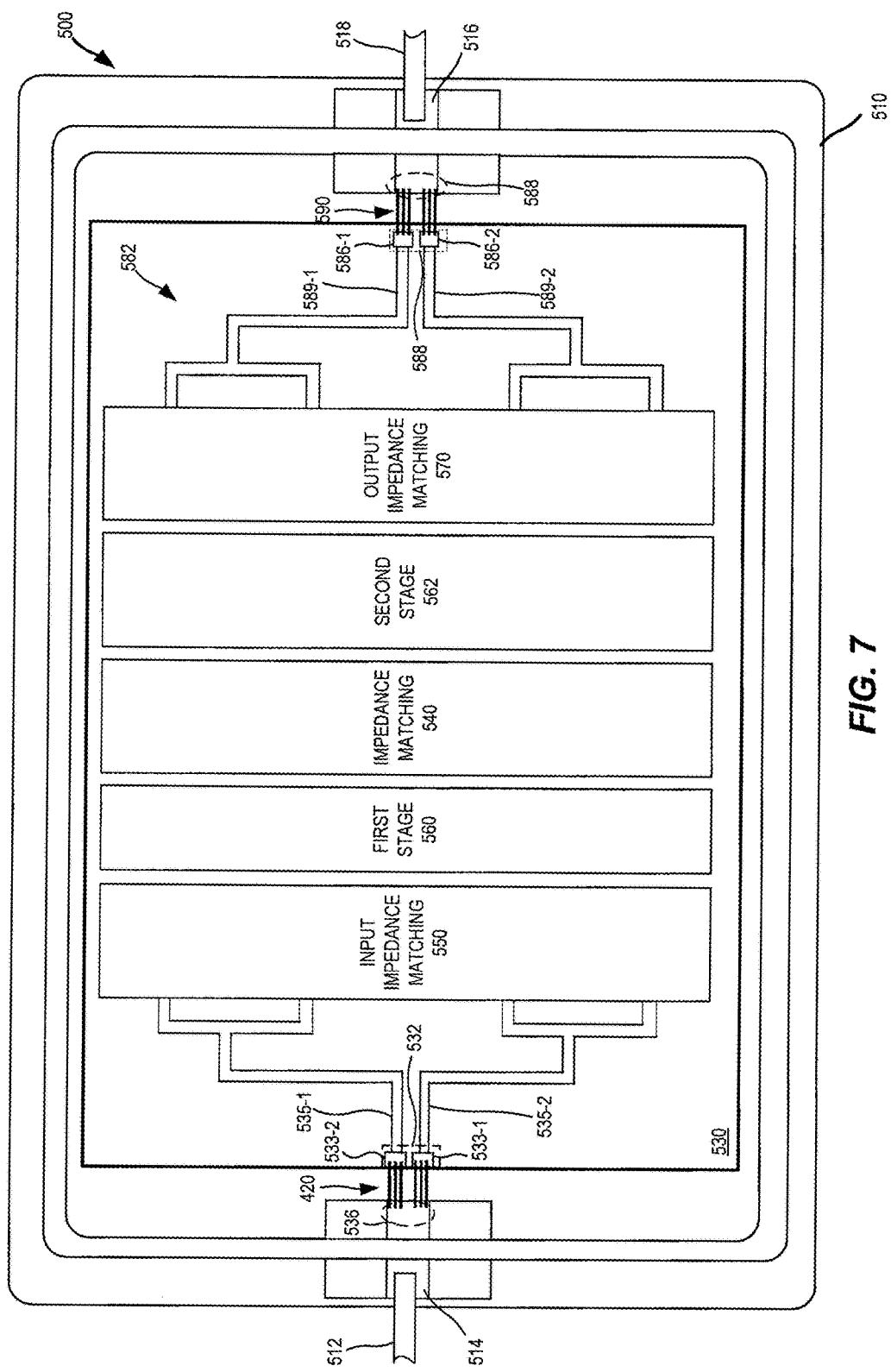
FIG. 7 is a plan view of a MMIC transistor amplifier according to embodiments of the present invention.
Figure 8:
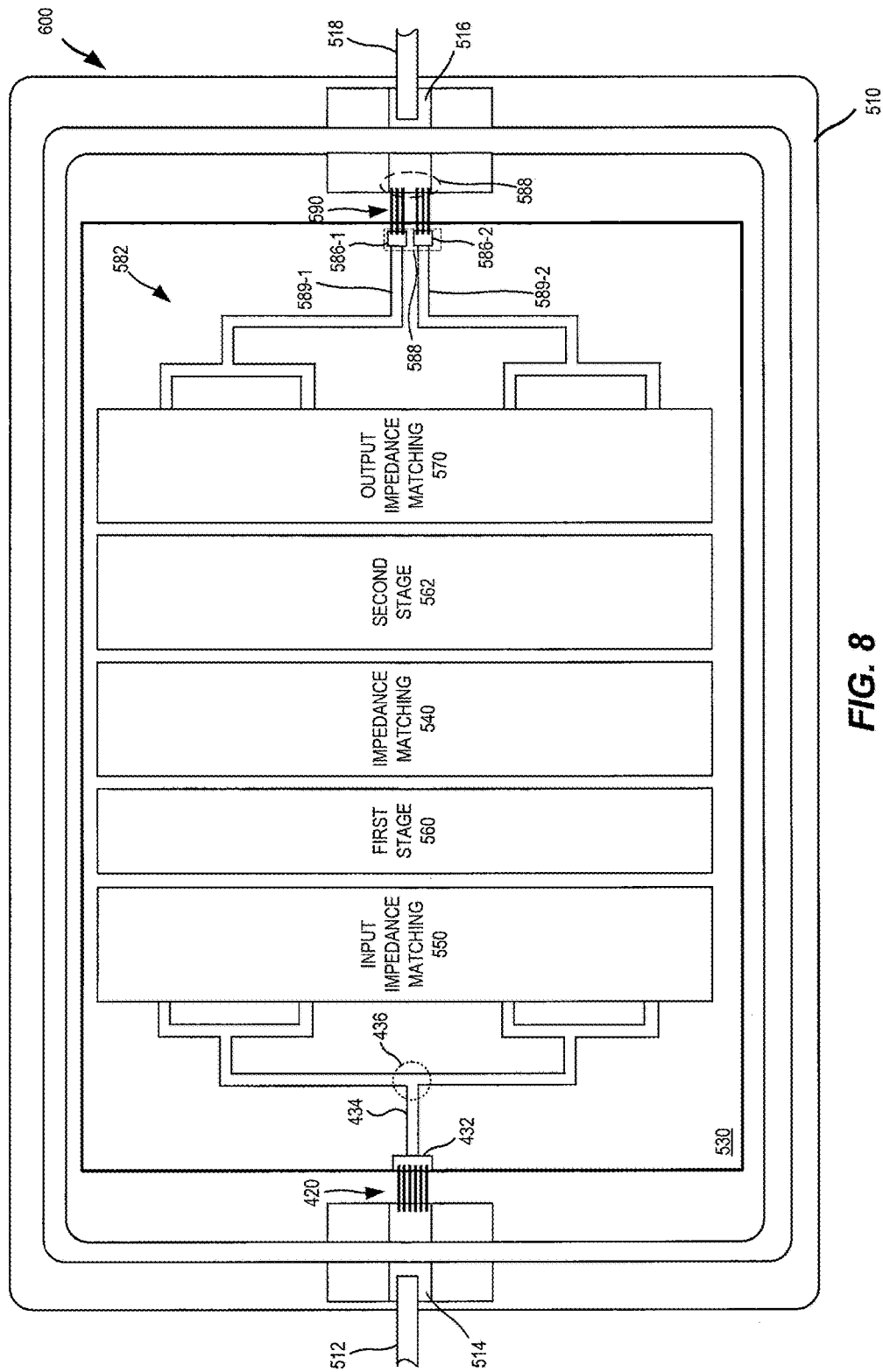
FIG. 8 is a plan view of a MMIC transistor amplifier according to further embodiments of the present invention.

FIG. 7 is a plan view of a MMIC transistor amplifier 500 according to embodiments of the present invention. As can be seen by comparing FIGS. 6 and 7, the MMIC transistor amplifier 500 may be similar to MMIC transistor amplifier 400. However, in MMIC transistor amplifier 500, the transmission line 434 of MMIC transistor amplifier 400 is split into two transmission lines 535-1, 535-2, and the transmission line 487 of MMIC transistor amplifier 400 is split into two transmission lines 589-1, 589-2. Because of these changes, the input bond pad 532 may be split, if necessary, into a pair of input bond pads 533-1, 533-2 so that the input splitting node 536 may be moved off of the integrated circuit chip 530 to the package 510, thereby adding the inductance of the input bond wires 520 within the feedback loop that extends between the input splitting node 536 and the output combining node 588. Additionally and/or alternatively, the output bond pad 585 may be split, if necessary, into a pair of output bond pads 586-1, 586-2 so that the output combining node 588 may be moved off of the integrated circuit chip 530 to the package 510, thereby adding the inductance of the output bond wires 590 within the feedback loop that extends between the input splitting node 536 and the output combining node 588. Thus, FIG. 7 shows that the techniques discussed above with respect to IMFET amplifiers 100 and 100' may also be applied to MMIC transistor amplifier designs to use the inductance of the input bond wires 520 and/or the output bond wires 590 to help stabilize the feedback loops. While the MMIC amplifier 500 of FIG. 7 is designed so that either or both the input bond pad 532 or the output bond pad 585 may be split, it will be appreciated that in other embodiments the input bond pad 532 may have the conventional design shown in FIG. 6 or the output bond pad 585 may have the conventional design shown in FIG. 6. FIG. 8 is a plan view of a MMIC transistor amplifier 600 in which a single input bond pad 432 is provided so that node splitting is only performed on the output bond pad.

Conventional gallium nitride based MMIC transistor amplifiers that have unit cell transistor designs with a plurality of parallel amplification paths have a single input bond pad and a single output bond pad, each of which are typically flanked by one or more ground pads which facilitates RF testing on a semiconductor wafer that may include a plurality of MMIC transistor amplifiers. During this RF testing, a single test signal of input power may be applied to drive and potentially saturate the MMIC transistor amplifier to ensure operability before the semiconductor wafer is diced into a plurality of MMIC transistor amplifier integrated circuit chips that are then packaged into individual MMIC transistor amplifiers. Such testing is a cost effective screening procedure. Another advantage of the node splitting techniques according to embodiments of the present invention is that the splitting of the input and/or output bond pads may not impact the above-described test procedures, since the conventionally used input and output bond pads are typically large enough to accept multiple probe tips. As such, splitting the input and/or output bond pads in two (or even into three or four smaller bond pads) may not impact the RF testing procedures at all. Thus, the techniques disclosed herein may provide a circuit designer additional degrees of freedom to incorporate bond wire inductance that is already a requisite part of the assembly into the feedback loops formed by the provision of multiple parallel amplification paths while not otherwise impacting the performance or testability of the MMIC transistor amplifiers.

Figure 9:
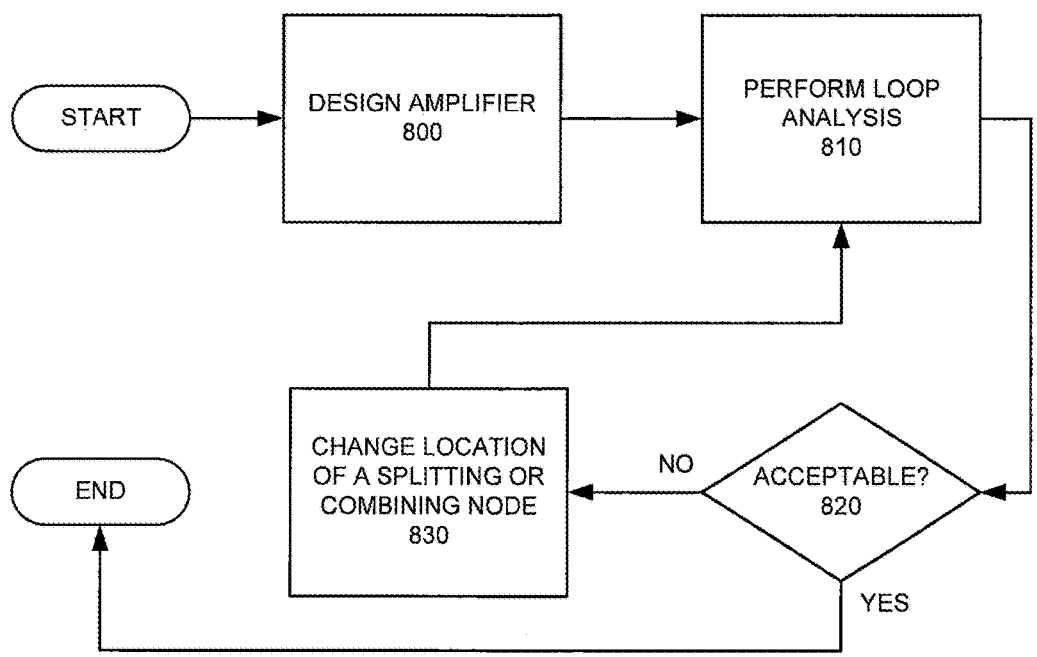
FIG. 9 is a flow chart of an amplifier design method according to certain embodiments of the present invention.

FIG. 9 is a flow chart of an amplifier design method according to certain embodiments of the present invention. As shown in FIG. 9, operations may begin with a circuit designer formulating a design for a packaged power amplifier (block 800). The packaged power amplifier may include a package having an input lead and an output lead and a transistor stage having a plurality of parallel amplification paths coupled between the input and output leads and included within the package. After the design is completed, a loop analysis simulation is performed (block 810). If the loop analysis simulation indicates that the device has a unacceptable level of instability (block 820), a location of one of an input splitting node of the packaged power amplifier where an input signal first splits to pass along plurality of parallel amplification paths and an output combining node of the packaged power amplifier where all of the plurality of parallel amplification paths first recombine is then changed (block 830). Operations then may return to block 810 where the loop analysis is again performed. Once the loop analysis indicates that the device is stable (block 820), then operations may end.

Pursuant to embodiments of the present invention, IMFET and MMIC transistor amplifiers are provided in which the input splitting node and/or the output combining node are moved so that the input bond wires and/or the output bond wires that connect to the package are moved within the feedback loops. By altering the location of the input splitting and/or output combining nodes, significant additional inductance may be moved within the feedback loop structure to stabilize the loop behavior. In other words, the ability to add the inductance of one or more additional bond wires provides a circuit designer additional degrees of freedom for stabilizing the circuit without the need for adding damping resistances.

While the above-described embodiments include corporate feed networks that have locations where an RF transmission lines splits into two RF transmission lines, and locations where two RF transmission lines combine into a single RF transmission line, it will be appreciated that in other embodiments the RF transmission line "splits" may be replaced with Wilkerson power splitter/combiners. The Wilkerson power splitter/combiners tend to be more complex and lossy, but provide better isolation between the output ports.

Embodiments of the inventive concepts may be particularly well suited for use in connection with Group III-nitride based high electron mobility transistor (HEMT) devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group III elements.

Suitable structures for GaN-based HEMTs that may utilize embodiments of the present invention are described, for example, in commonly assigned U.S. Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023A1 for "Group-III Nitride Based High Electron Mobility Transistor (HEMT) With Barrier/Spacer Layer," published Nov. 14, 2002, U.S. Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

In particular embodiments of the present invention, the substrate 250 may be a semi-insulating silicon carbide (SiC) substrate that may be, for example, 4H polytype of silicon carbide. Other silicon carbide candidate polytypes include the 3C, 6H, and 15R polytypes.

Optional buffer, nucleation and/or transition layers (not shown) may be provided on the substrate 250 beneath the channel layer 260. For example, an AlN buffer layer may be included to provide an appropriate crystal structure transition between the silicon carbide substrate and the remainder of the device. Additionally, strain balancing transition layer(s) may also be provided as described, for example, in commonly assigned U.S. Publication 2003/0102482A1, published Jun. 5, 2003, and entitled "Strain Balanced Nitride Hetrojunction Transistors And Methods Of Fabricating Strain Balanced Nitride Heterojunction Transistors," the disclosure of which is incorporated herein by reference as if set forth fully herein. Moreover, one or more capping layers, such as SiN capping layers, may be provided on the barrier layer 220.

Silicon carbide has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

In some embodiments of the present invention, the channel layer 260 is a Group III-nitride, such as $Al_xGa_{1-x}N$ where $0 \leq x < 1$, provided that the energy of the conduction band edge of the channel layer 260 is less than the energy of the conduction band edge of the barrier layer 270 at the interface between the channel and barrier layers. In certain embodiments of the present invention, x=0, indicating that the channel layer 260 is GaN. The channel layer 260 may also be other Group III-nitrides such as InGaN, AlInGaN or the like. The channel layer 260 may be undoped or unintentionally doped and may be grown to a thickness of greater than about 20 Å. The channel layer 260 may also be a multi-layer structure, such as a superlattice or combinations of GaN, AlGaN or the like.

The channel layer 260 may have a bandgap that is less than the bandgap of the barrier layer 270, and the channel layer 260 may also have a larger electron affinity than the barrier layer 270. In certain embodiments of the inventive concepts, the barrier layer 270 is AlN, AlInN, AlGaN or AlInGaN with a thickness of between about 0.1 nm and about 10 nm. In particular embodiments of the inventive concepts, the barrier layer 270 is thick enough and has a high enough Al composition and doping to induce a significant carrier concentration at the interface between the channel layer 260 and the barrier layer 270.

The barrier layer 270 may be a Group III-nitride and has a bandgap larger than that of the channel layer 260 and a smaller electron affinity than the channel layer 260. Accordingly, in certain embodiments of the present invention, the barrier layer 270 may include AlGaN, AlInGaN and/or AlN or combinations of layers thereof. The barrier layer 270 may, for example, be from about 0.1 nm to about 30 nm thick. In certain embodiments of the present invention, the barrier layer 270 is undoped or doped with an n-type dopant to a concentration less than about $10^{19}$ cm$^{-3}$. In some embodiments of the present invention, the barrier layer 270 is $Al_xGa_{1-x}N$ where $0<x<1$. In particular embodiments, the aluminum concentration is about 25%. However, in other embodiments of the present invention, the barrier layer 270 comprises AlGaN with an aluminum concentration of between about 5% and about 100%. In specific embodiments of the present invention, the aluminum concentration is greater than about 10%.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged transistor amplifier, comprising:
a package having an input lead and an output lead;
a transistor stage having a plurality of unit cell transistors that are electrically connected in parallel and that are coupled to the input lead, each of the unit cell transistors having an output;
a first output bond pad that is coupled to a first subset of the outputs of the unit cell transistors by a first feed network;
a second output bond pad that is separate from the first output bond pad, the second output bond pad coupled to a second subset of the outputs of the unit cell transistors by a second feed network;
a first output bond wire coupled between the first output bond pad and the output lead; and
a second output bond wire coupled between the second output bond pad and the output lead,
wherein the first output bond wire is directly connected between the first output bond pad and the package and the second output bond wire is directly connected between the second output bond pad and the package.

2. The packaged transistor amplifier of claim 1, wherein the first output bond wire is directly connected to an output lead pad of the package and the second output bond wire is directly connected to the output lead pad.

3. The packaged transistor amplifier of claim 1, wherein the packaged transistor amplifier includes first and second input bond pads and first and second input bond wires, the first and second input bond wires directly electrically connect the input lead to the respective first and second input bond pads.

4. The packaged transistor amplifier of claim 3, wherein the first and second input bond wires are directly connected between the respective first and second input bond pads and an input lead pad of the package.

5. The packaged transistor amplifier of claim 1, wherein the first output bond pad is directly adjacent the second output bond pad.

6. The packaged transistor amplifier of claim 3, wherein the packaged transistor amplifier includes different numbers of input bond wires and output bond wires.

7. The packaged transistor amplifier of claim 3, wherein an inductance of at least one of the first and second input bond wires differs from an inductance of at least one of the first and second output bond wires by at least 10%.

8. A packaged transistor amplifier, comprising:
a package having an input lead and an output lead;
an input impedance matching network coupled to the input lead;
a transistor stage having a plurality of unit cell transistors that are electrically in parallel, the transistor stage coupled to the input impedance matching network, each of the unit cell transistors having an output;
an output impedance matching network coupled to the transistor stage;
a plurality of output bond wires coupled between the output impedance matching network and the output lead; and
an output combining node coupled to the outputs of the plurality of unit cell transistors,
wherein the plurality of output bond wires are coupled between the transistor stage and the output combining node.

9. The packaged transistor amplifier of claim 8, wherein each of the output bond wires is directly connected to the package.

10. The packaged transistor amplifier of claim 9, further comprising first and second output bond pads, wherein a first of the output bond wires is directly connected between the first output bond pad and a lead pad for the output lead and a second of the output bond wires is directly connected between the second output bond pad and the lead pad for the output lead.

11. The packaged transistor amplifier of claim 10, wherein the packaged transistor amplifier includes at least first and second input bond pads and at least first and second input bond wires that directly electrically connect the input lead to the respective first and second input bond pads.

12. The packaged transistor amplifier of claim 11, wherein an inductance of at least one of the input bond wires differs from an inductance of at least one of the output bond wires by at least 10%.

13. The packaged transistor amplifier of claim 11, further comprising a third output bond pad, wherein a third of the output bond wires is coupled between the third output bond pad and the output lead.

14. The packaged transistor amplifier of claim 13, further comprising a third input bond pad and a third input bond wire, wherein the third input bond wire is coupled between the third input bond pad and the input lead.

15. A packaged transistor amplifier, comprising:
a package having an input lead and an output lead;
one or more circuit substrates within the package, the one or more circuit substrates including a plurality of electrically parallel amplification paths, each of the amplification paths coupled to the input lead and to the output lead; and
a plurality of output bond wires that couple the output lead to at least one of the one or more circuit substrates;
wherein the output bond wires are between the one or more circuit substrates and a location where all of the electrically parallel amplification paths are first combined together.

16. The packaged transistor amplifier of claim 15, wherein the packaged transistor amplifier includes at least first and second input bond pads and at least first and second input bond wires that electrically connect the input lead to the respective first and second input bond pads.

17. The packaged transistor amplifier of claim 16, wherein the first and second input bond wires are directly connected between the package and the respective first and second input bond pads.

18. The packaged transistor amplifier of claim 16, wherein the first and second input bond wires are part of a plurality of input bond wires, and wherein the packaged transistor amplifier includes different numbers of input bond wires and output bond wires.

19. The packaged transistor amplifier of claim 11, wherein the packaged transistor amplifier includes different numbers of input bond wires and output bond wires.

\* \* \* \* \*